United States Patent
Fan et al.

(10) Patent No.: US 8,946,732 B2
(45) Date of Patent: Feb. 3, 2015

(54) TOUCH PANEL HAVING PHOTO-SENSORS AND READ-OUT TRANSISTORS AND FABRICATING METHOD THEREOF

(71) Applicant: Au Optronics Corporation, Hsinchu (TW)

(72) Inventors: Chi-Wen Fan, New Taipei (TW); Tien-Hao Chang, Taoyuan County (TW); Zao-Shi Zheng, Kaohsiung (TW); Chun Chang, Kaohsiung (TW); Wei-Peng Weng, Kaohsiung (TW); An-Thung Cho, Hualien County (TW); Jiun-Jye Chang, Hsinchu (TW)

(73) Assignee: Au Optronics Corporation, Hsinchu (TW)

( * ) Notice: Subject to any disclaimer, the term of this patent is extended or adjusted under 35 U.S.C. 154(b) by 32 days.

(21) Appl. No.: 13/831,942

(22) Filed: Mar. 15, 2013

(65) Prior Publication Data
US 2013/0270618 A1    Oct. 17, 2013

(30) Foreign Application Priority Data
Apr. 16, 2012   (TW) .............................. 101113480 A

(51) Int. Cl.
*H01L 27/146*   (2006.01)

(52) U.S. Cl.
CPC ...... *H01L 27/1462* (2013.01); *H01L 27/14678* (2013.01)
USPC ................................ 257/84; 257/290; 438/66

(58) Field of Classification Search
USPC ..................................................... 257/59, 72
See application file for complete search history.

(56) References Cited

U.S. PATENT DOCUMENTS

| | | | |
|---|---|---|---|
| 6,818,923 B2 | 11/2004 | Kim et al. | |
| 8,148,185 B2 | 4/2012 | Chen et al. | |
| 8,597,968 B2 | 12/2013 | Chen et al. | |
| 8,692,250 B2 | 4/2014 | Lee et al. | |
| 2006/0125971 A1* | 6/2006 | Abileah et al. | 349/42 |
| 2008/0084374 A1* | 4/2008 | Abileah et al. | 345/87 |

(Continued)

FOREIGN PATENT DOCUMENTS

| | | |
|---|---|---|
| TW | 201005833 | 2/2010 |
| TW | 201039406 | 11/2010 |

OTHER PUBLICATIONS

"First Office Action of China Counterpart Application", issued on Jun. 26, 2014, p. 1-p. 12.

(Continued)

*Primary Examiner* — Bilkis Jahan
(74) *Attorney, Agent, or Firm* — Jianq Chyun IP Office

(57) ABSTRACT

A touch panel and fabricating method thereof are provided. The patterned transparent conductive layer, disposed on the substrate, includes first electrodes. The photo-sensing layers are disposed on the first electrodes. The first patterned conductive layer includes gate electrodes, scan lines and second electrodes. The gate electrodes and the scan lines are disposed on the substrate. The second electrodes are disposed on the photo-sensing layers. The first electrodes, the photo-sensing layers and the second electrodes constitute photo-sensors. The second patterned conductive layer includes source electrodes and drain electrodes, wherein the gate electrodes, the channel layers, the source electrodes and the drain electrodes constitute read-out transistors and each of the read-out transistors is electrically connected to the corresponding photo-sensor respectively.

23 Claims, 12 Drawing Sheets

(56) References Cited

U.S. PATENT DOCUMENTS

| | | |
|---|---|---|
| 2009/0032824 A1* | 2/2009 | Suzumura et al. ............ 257/84 |
| 2009/0243020 A1 | 10/2009 | Chabinyc et al. |
| 2009/0283850 A1* | 11/2009 | Cho et al. .................. 257/466 |
| 2010/0012937 A1* | 1/2010 | Lee et al. ..................... 257/59 |
| 2010/0053118 A1 | 3/2010 | Chen |
| 2010/0171905 A1 | 7/2010 | Huang et al. |
| 2010/0267177 A1 | 10/2010 | Chen et al. |
| 2012/0112214 A1 | 5/2012 | Chen et al. |

OTHER PUBLICATIONS

"Office Action of Taiwan Counterpart Application", issued on Jun. 19, 2014, p. 1-p. 11.

* cited by examiner

TOUCH PANEL HAVING PHOTO-SENSORS AND READ-OUT TRANSISTORS AND FABRICATING METHOD THEREOF

CROSS-REFERENCE TO RELATED APPLICATION

This application claims the priority benefit of Taiwan application serial no. 101113480, filed on Apr. 16, 2012. The entirety of the above-mentioned patent application is hereby incorporated by reference herein and made a part of this specification.

BACKGROUND OF THE DISCLOSURE

1. Field of the Disclosure

The present invention relates to a touch panel and fabricating method thereof. More particularly, the present invention relates to an optical touch panel and fabricating method thereof.

2. Description of Related Art

If a touch panel is integrated into a liquid crystal display (LCD), not only users can conveniently and rapidly implement inputting data, but also accessing function can be interactively provided. Thus, the touch panels are gradually applied into some portable electronic devices such as mobile phones, personal digital assistants (PDA), notebooks or the like.

Currently, the integrating of touch sensing and displaying functions are realized by the technique of embedding photo-sensors into the pixel array of the liquid crystal display device. Specifically, whether the touch event occurs or not is determined by the voltage drop due to the photocurrent which is generated because the embedded photo-sensor is illuminated under light.

FIG. 1A to FIG. 1F are cross-sectional views illustrating a fabricating process of a conventional touch panel. With reference to FIG. 1A, first, a plurality of gate electrodes GE are formed on a substrate 110, and for the sake of convenience of illustration, only one gate electrode GE is shown in FIG. 1A.

Referring to FIG. 1B, on the substrate 110, a first dielectric layer GI, a plurality of channel layers CH and a plurality of ohmic contact layers OC are sequentially formed, wherein the first dielectric layer GI covers the gate electrodes GE and the substrate 110. The channel layers CH and the ohmic contact layers OC are located on the first dielectric layer GI which is corresponding to the gate electrodes GE. The channel layers CH are located between the ohmic contact layers OC and the first dielectric layer GI.

Referring to FIG. 1C, on the substrate 110, a plurality of source electrodes SE, a plurality of drain electrodes DE and a plurality of first electrodes E1 are sequentially formed. Herein the source electrodes SE and the drain electrodes DE are used as a mask when removing a portion of the ohmic contact layers OC such that a plurality of ohmic contact patterns OCP are formed. The source electrodes SE and the drain electrodes DE are respectively located on two opposite sides of the channel layers CH and cover a portion of the channel layers CH. Herein the gate electrodes GE, the channel layers CH, the source electrodes SE and the drain electrodes DE constitute a plurality of read-out transistors T.

Referring to FIG. 1D, a second dielectric layer PV is formed, in order to cover the read-out transistors T, a portion of the first electrodes E1 and a portion of the first dielectric layer GI.

Referring to FIG. 1E, a plurality of photo-sensing layers PS are formed, so as to electrically connected to the first electrodes E1, wherein a portion of the second dielectric layer PV is located between the first electrode E1 and the photo-sensing layers PS.

Referring to FIG. 1F, on the substrate 110, a plurality of second electrodes E2 and a plurality of read-out lines ROL electrically connected to the second electrodes E2 are formed, wherein the second electrodes E2 are respectively located on the corresponding photo-sensing layers PS, and the photo-sensing layers PS are located between the second electrodes E2 and the first electrodes E1. Herein the second electrodes E2, the photo-sensing layers PS and the first electrodes E1 constitute a plurality of photo-sensors S. After the photo-sensors S are formed, the fabrication of the touch panel 100 is initially completed.

In the conventional touch panel 100, since the read-out transistors T and the photo-sensors S do not have display function, color filter layer is not needed to dispose above the read-out transistors T and the photo-sensors S. Accordingly, without having any other layer for protection, in order to avoid the read-out transistors T and the photo-sensors S of the touch panel 100 causing damages due to external environment and human factors, the touch panel 100 is often needed to dispose an extra protective component (e.g., cover plate). Therefore, it may cause the manufacturing cost increased and the complexity of the fabricating process may also be increased.

SUMMARY OF THE DISCLOSURE

The present invention provides a touch panel, and the fabricating method thereof is simple and has a good reliability.

The present invention further provides a fabricating method of a touch panel for producing a touch panel with low cost.

The present invention provides a touch panel including a substrate, a patterned transparent conductive layer, a plurality of photo-sensing layers, a first patterned conductive layer, a first dielectric layer, a plurality of channel layers and a second patterned conductive layer. The patterned transparent conductive layer is disposed on the substrate, and the patterned transparent conductive layer includes a plurality of first electrodes. The photo-sensing layers are disposed on the first electrodes. The first patterned conductive layer includes a plurality of gate electrodes, a plurality of scan lines connected to the gate electrodes and a plurality of second electrodes, wherein the gate electrodes and the scan lines are located on the substrate, the second electrodes are located on the photo-sensing layers, and the first electrodes, the photo-sensing layers and the second electrodes constitute a plurality of photo-sensors. The first dielectric layer is disposed on the substrate to cover the gate electrodes, the scan lines and the photo-sensors. The plurality of channel layers are disposed on the first dielectric layer and located above the gate electrodes. The second patterned conductive layer includes a plurality of source electrodes and a plurality of drain electrodes, wherein the gate electrodes, the channel layers, the source electrodes and the drain electrodes constitute a plurality of read-out transistors, and each of the read-out transistors is electrically connected to the corresponding photo-sensor, respectively.

According to one exemplary embodiment of the present invention, the patterned transparent conductive layer further includes a plurality of read-out pads.

According to one exemplary embodiment of the present invention, the first patterned conductive layer further includes a plurality of bonding pads. Each of the bonding pads covers one of the read-out pads, and each of the read-out transistors is electrically connected to the corresponding read-out pad and the corresponding bonding pad, respectively.

According to one exemplary embodiment of the present invention, the photo-sensing layers include a silicon-rich oxide layer.

According to one exemplary embodiment of the present invention, the touch panel further includes a second dielectric layer and a third patterned conductive layer, wherein the second dielectric layer covers the photo-sensors and the read-out transistors, the third patterned conductive layer is disposed on the second dielectric layer, and the third patterned conductive layer shields the channel layers.

According to one exemplary embodiment of the present invention, the touch panel further includes a backlight unit, wherein the third patterned conductive layer is located between the backlight unit and the channel layers.

According to one exemplary embodiment of the present invention, the touch panel further includes a side light source adjacent to an edge of the substrate, wherein the side light source is adapted to provide light to the interior of the substrate.

According to one exemplary embodiment of the present invention, the touch panel further includes an encapsulant covering the photo-sensors and the read-out transistors.

According to one exemplary embodiment of the present invention, the touch panel further includes an organic planarization layer and a thin film encapsulant, wherein the organic planarization layer covers the photo-sensors and the read-out transistors, and the thin film encapsulant is disposed on the organic planarization layer.

The present invention provides a fabricating method of a touch panel including the following steps: First, a patterned transparent conductive layer is formed on a substrate, wherein the patterned transparent conductive layer includes a plurality of first electrodes. Next, a plurality of photo-sensing layers are formed on the first electrodes. Then, a first patterned conductive layer is formed. The first patterned conductive layer includes a plurality of gate electrodes, a plurality of scan lines connected to the gate electrodes and a plurality of second electrodes, wherein the gate electrodes and the scan lines are located on the substrate, the second electrodes are located on the photo-sensing layers, and the first electrodes, the photo-sensing layers and the second electrodes constitute a plurality of photo-sensors. A first dielectric layer is formed on the substrate to cover the gate electrodes, the scan lines and the photo-sensors. A plurality of channel layers are formed on the first dielectric layer, wherein the channel layers are located above the gate electrodes. A second patterned conductive layer is formed, wherein the second patterned conductive layer includes a plurality of source electrodes and a plurality of drain electrodes. The gate electrodes, the channel layers, the source electrodes and the drain electrodes constitute a plurality of read-out transistors, and each of the read-out transistors is electrically connected to the corresponding photo-sensor, respectively.

According to one exemplary embodiment of the present invention, the step of forming the patterned transparent conductive layer further includes forming a plurality of read-out pads on the substrate.

According to one exemplary embodiment of the present invention, the step of forming the first patterned conductive layer further includes forming a plurality of bonding pads. Each of the bonding pads covers one of the read-out pads, and each of the read-out transistors is electrically connected to the corresponding read-out pad and the corresponding bonding pad, respectively.

According to one exemplary embodiment of the present invention, the fabricating method of a touch panel further includes forming a second dielectric layer on the photo-sensors and the read-out transistors, and forming a third dielectric layer on the second dielectric layer, wherein the third dielectric layer shields the channel layers.

According to one exemplary embodiment of the present invention, the fabricating method of a touch panel further includes providing a backlight unit, wherein the third patterned conductive layer is located between the backlight unit and the channel layers.

According to one exemplary embodiment of the present invention, the fabricating method of a touch panel further includes providing a side light source adjacent to an edge of the substrate, wherein the side light source is adapted to provide light to the interior of the substrate.

According to one exemplary embodiment of the present invention, the fabricating method of a touch panel further includes forming an encapsulant on the photo-sensors and the read-out transistors.

According to one exemplary embodiment of the present invention, the fabricating method of a touch panel further includes forming an organic planarization layer on the photo-sensors and the read-out transistors, and forming a thin film encapsulant on the organic planarization layer.

In light of the above, through alternating the order of fabricating process of each layer of the photo-sensors, the read-out transistors and the photo-sensors of the touch panel of the present invention can have a good protection.

In order to make the aforementioned properties and advantages of the invention more comprehensible, embodiments accompanied with figures are described in detail below.

BRIEF DESCRIPTION OF THE DRAWINGS

The accompanying drawings constituting a part of this specification are incorporated herein to provide a further understanding of the invention. Here, the drawings illustrate embodiments of the invention and, together with the description, serve to explain the principles of the invention.

FIG. 2A to FIG. 2I are cross-sectional views illustrating a fabricating process of a touch panel according to the first embodiment of the present invention.

DETAILED DESCRIPTION OF THE EMBODIMENTS

First Embodiment

FIG. 2A to FIG. 2I are cross-sectional views illustrating a fabricating process of a touch panel according to the first embodiment of the present invention. FIG. 3A to FIG. 3H are schematic top views of the touch panel in FIG. 2A to FIG. 2H.

Figure 1A:
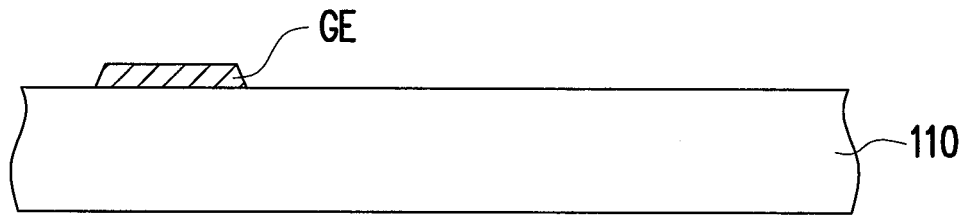
FIG. 1A to FIG. 1F are cross-sectional views illustrating a fabricating process of a conventional touch panel.
Figure 1B:
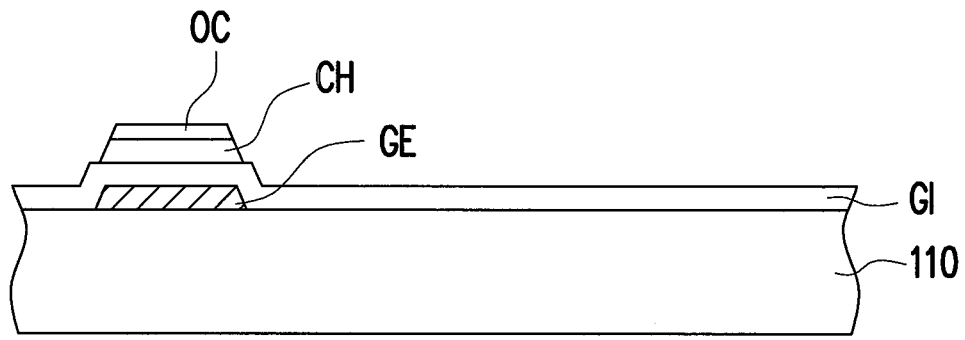
Figure 1C:
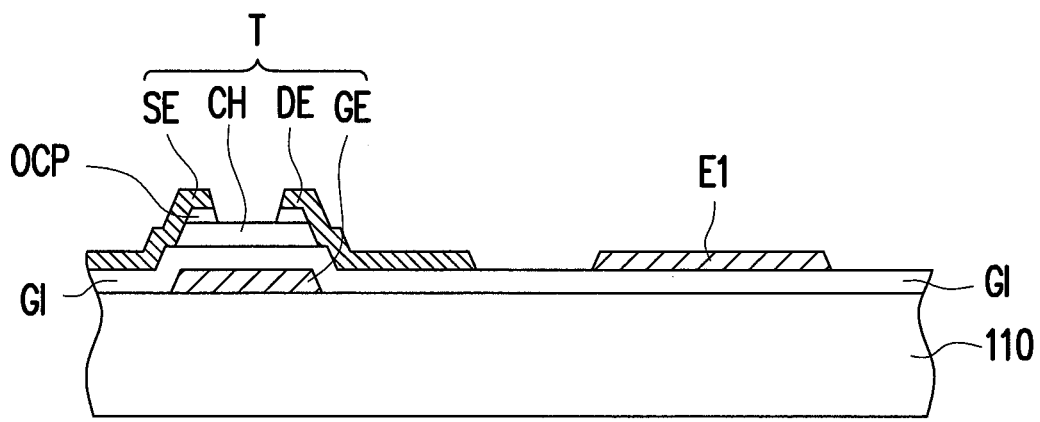
Figure 1D:
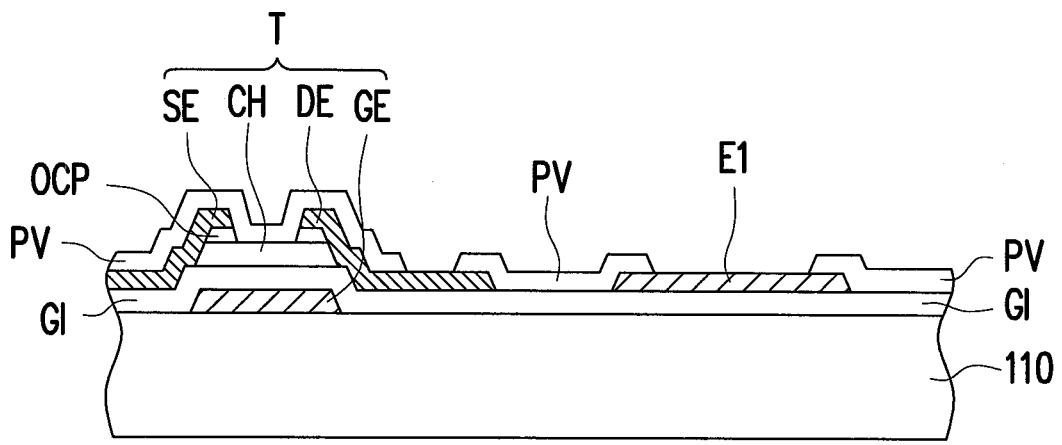
Figure 1E:
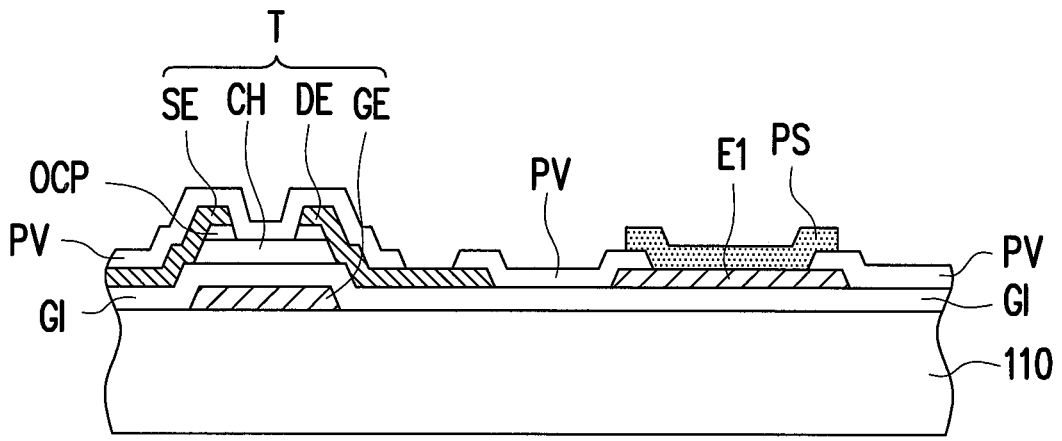
Figure 1F:
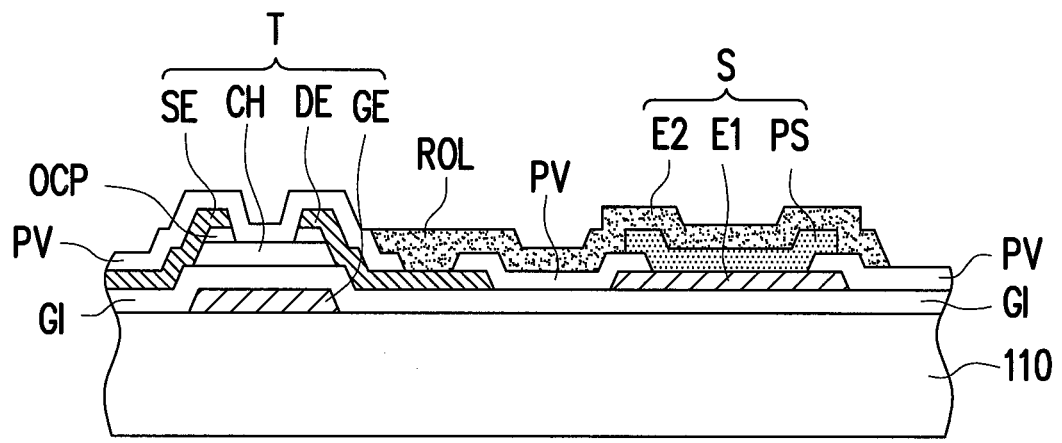
Figure 2A:
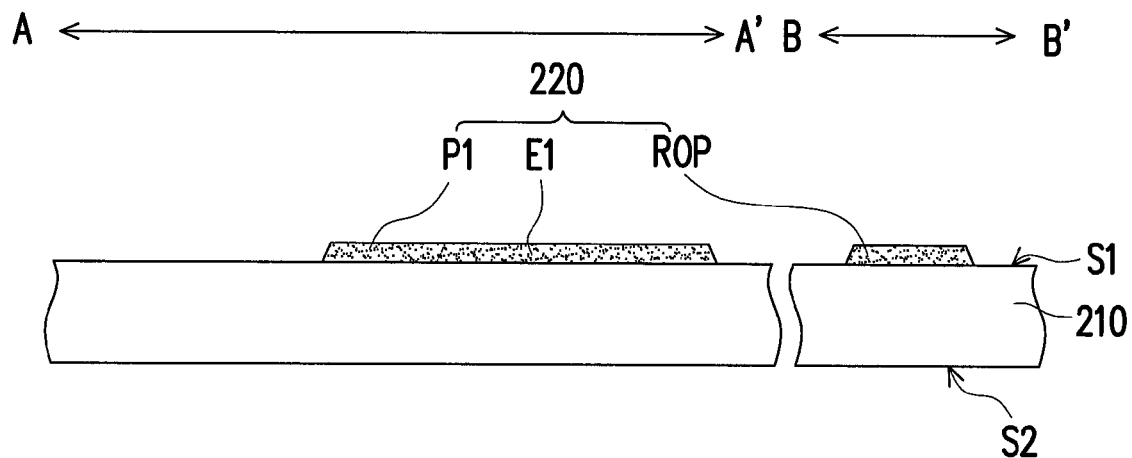
Figure 3A:
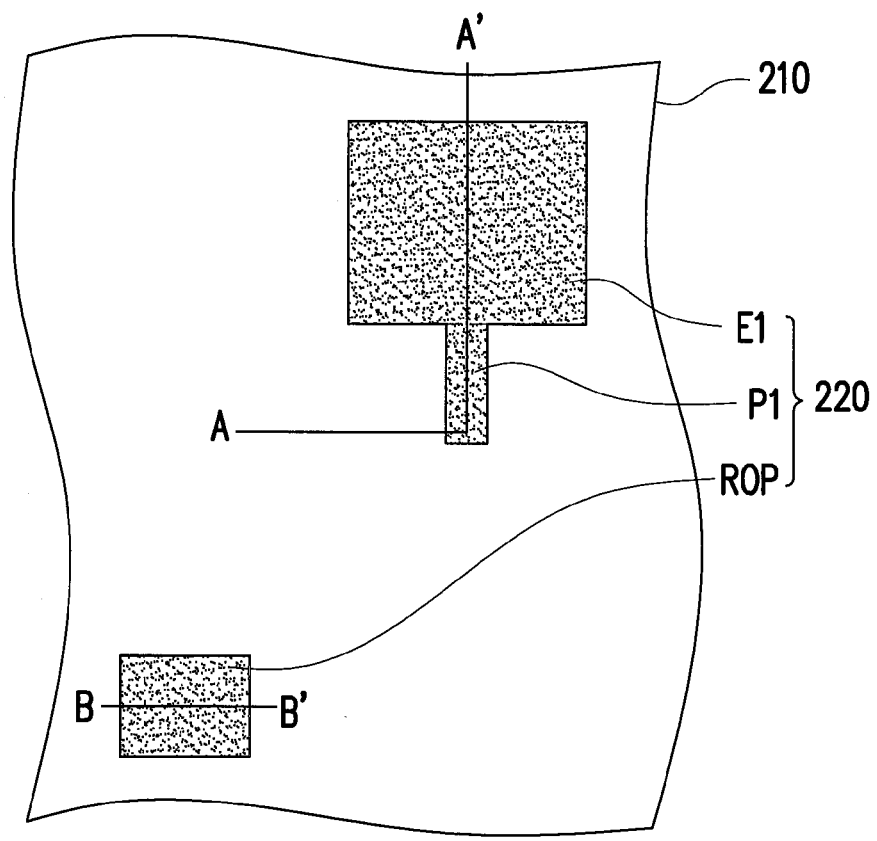
FIG. 3A to FIG. 3H are schematic top views of the touch panel in FIG. 2A to FIG. 2H.

First of all, referring to FIG. 2A and FIG. 3A, a substrate 210 is provided, wherein the substrate 210 has an inner surface S1 and an outer surface S2 opposite to the inner surface S1. A patterned transparent conductive layer 220 is formed on the inner surface S1 of substrate 210, wherein the patterned transparent conductive layer 220 includes a plurality of first electrodes E1 and a plurality of read-out pads ROP. In the present embodiment, the patterned transparent conductive layer 220 further includes a plurality of contact portions P1, and each of the contact portions P1 is connected to the corresponding first electrode E1, respectively. In addition, a material of the patterned transparent conductive layer 220 may be a metal oxide, such as indium tin oxide (ITO), indium zinc oxide (IZO), aluminum tin oxide (ATO), aluminum zinc oxide (AZO), indium germanium zinc oxide (IGZO), or other suitable materials, or a stacked layer including at least two of above materials.

Figure 2B:
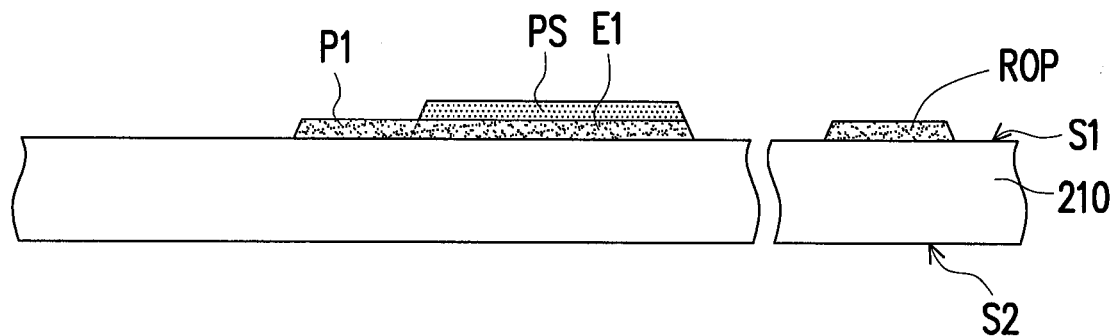
Figure 3B:
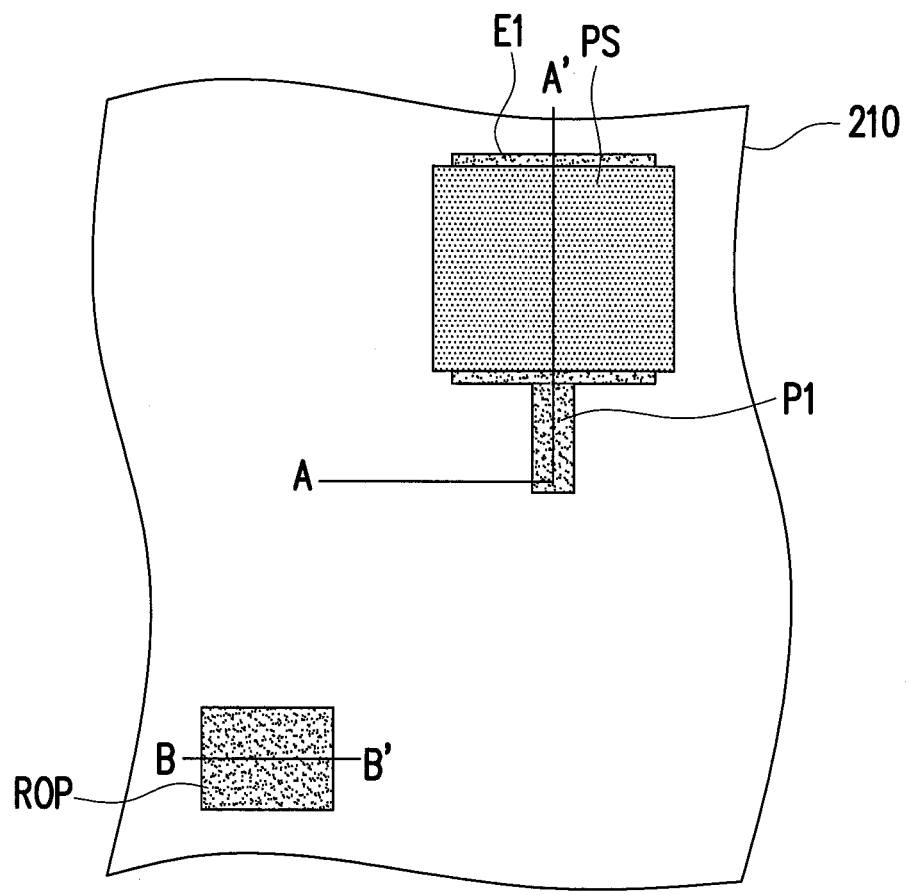

Referring to FIG. 2B and FIG. 3B, then, a plurality of photo-sensing layers PS are formed on the first electrodes E1, wherein the photo-sensing layers PS include a silicon-rich oxide layer or any other materials adapted to generate photo-current under light sensitization.

Figure 2C:
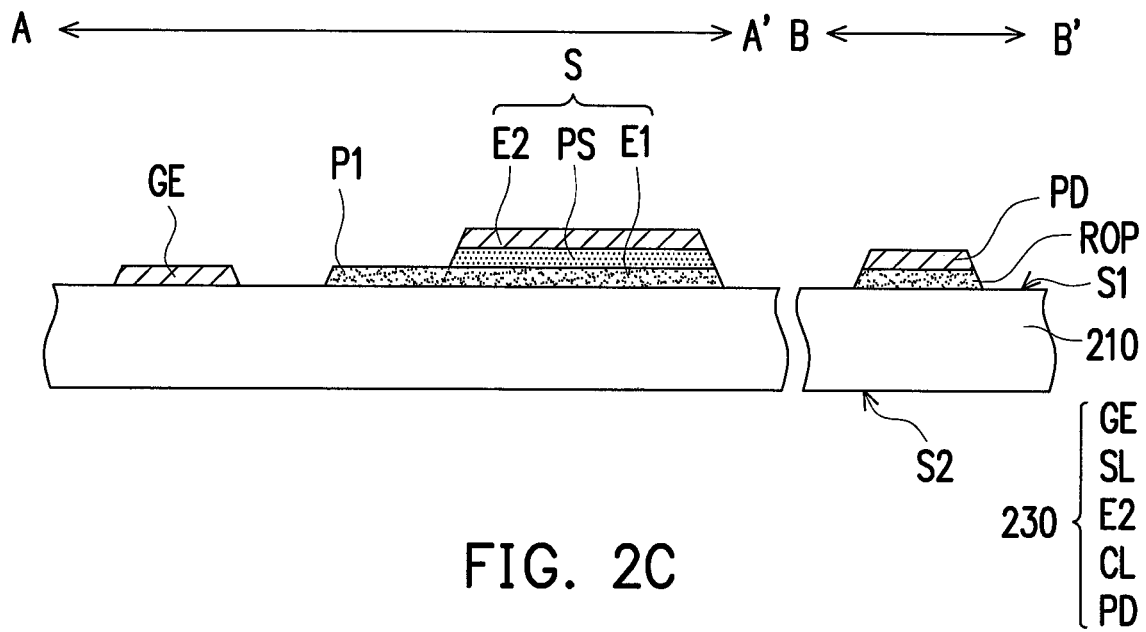
Figure 3C:
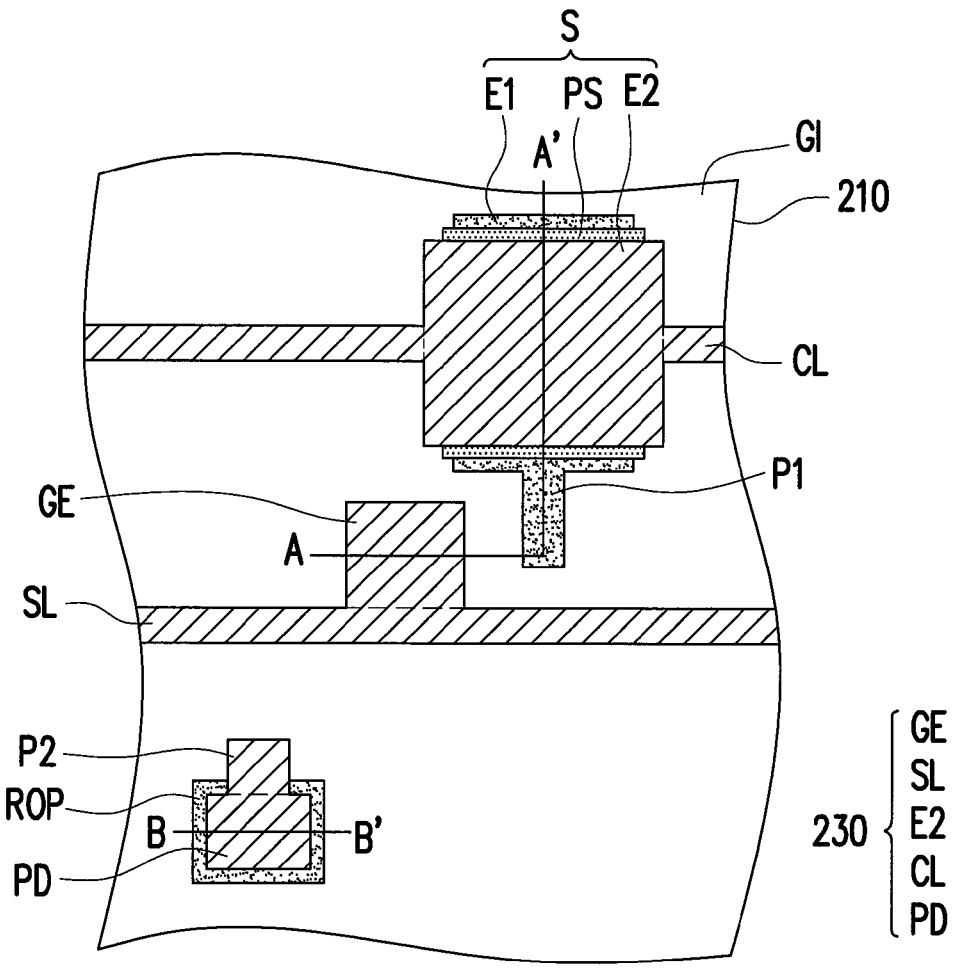

Referring to FIG. 2C and FIG. 3C, a first patterned conductive layer 230 is formed. The first patterned conductive layer 230 includes a plurality of gate electrodes GE, a plurality of scan lines SL connected to the gate electrodes GE and a plurality of second electrodes E2, wherein the gate electrodes GE and the scan lines SL are located on the substrate 210, the second electrodes E2 are respectively located above the corresponding photo-sensing layers PS, and the first electrodes E1, the photo-sensing layers PS and the second electrodes E2 constitute a plurality of photo-sensors S. Additionally, the material of the patterned conductive layer 230 may be metal or multi-layered metal having favorable electrical conductivity.

In the embodiment, the first patterned conductive layer 230 further includes a plurality of bonding pads PD and a plurality of common lines CL, wherein each of the bonding pads PD covers one of the read-out pads ROP, and the common lines CL are connected to the corresponding second electrodes E2, respectively. In addition, each of the bonding pads PD has a contact portion P2.

Figure 2D:
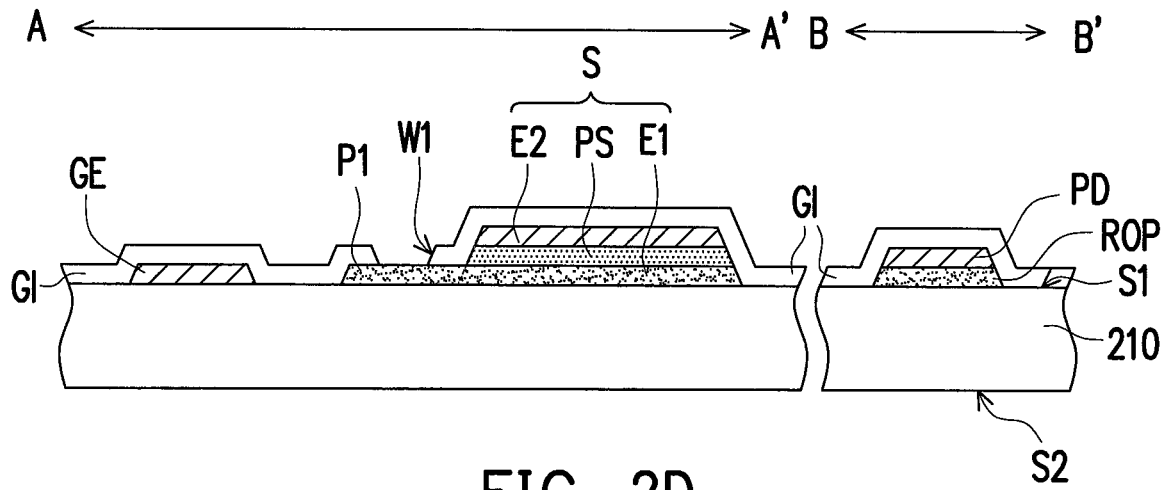
Figure 3D:
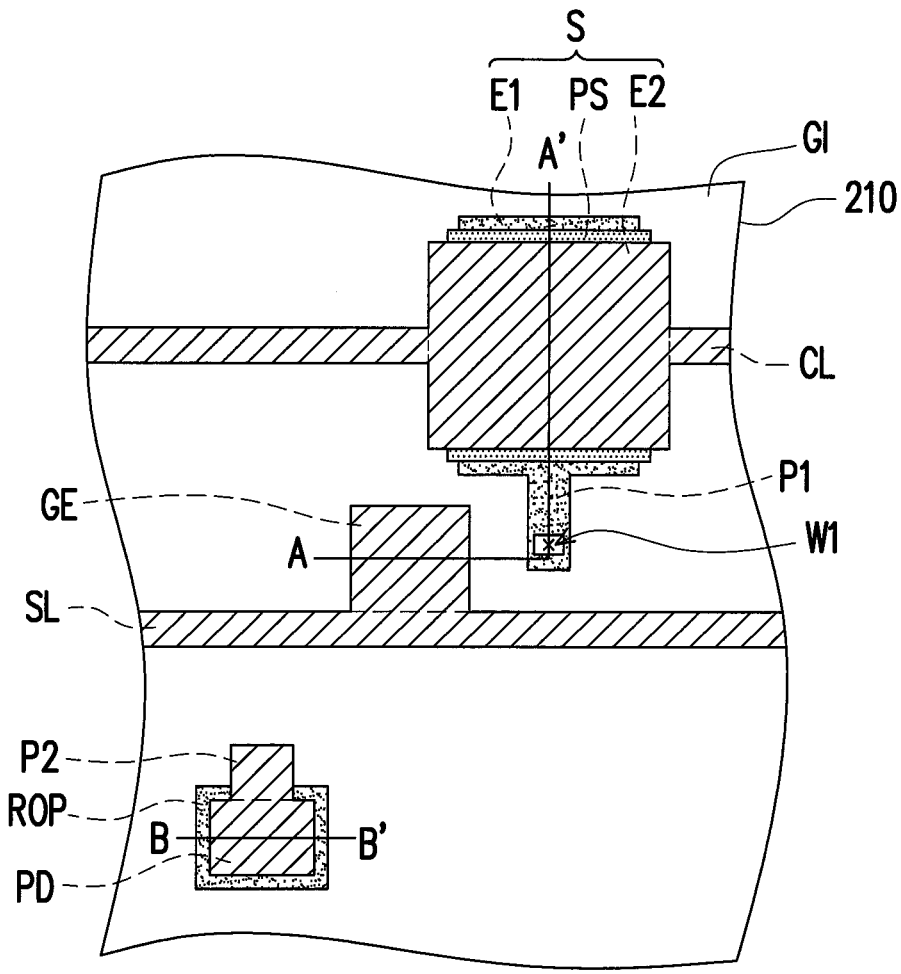

Referring to FIG. 2D and FIG. 3D, a first dielectric layer GI is formed on the substrate 210, so as to cover the gate electrodes GE, the scan lines SL, the photo-sensors S and the bonding pads PD. Then, the first dielectric layer GI is patterned to fabricate a contact window W1 in the dielectric layer GI which corresponds to each of the contact portions P1, wherein the contact window W1 exposes a portion of the first electrode E1. Further, the material of the first dielectric layer GI is an insulating material such as silicon oxide or silicon nitride with high dielectric constant.

Figure 2E:
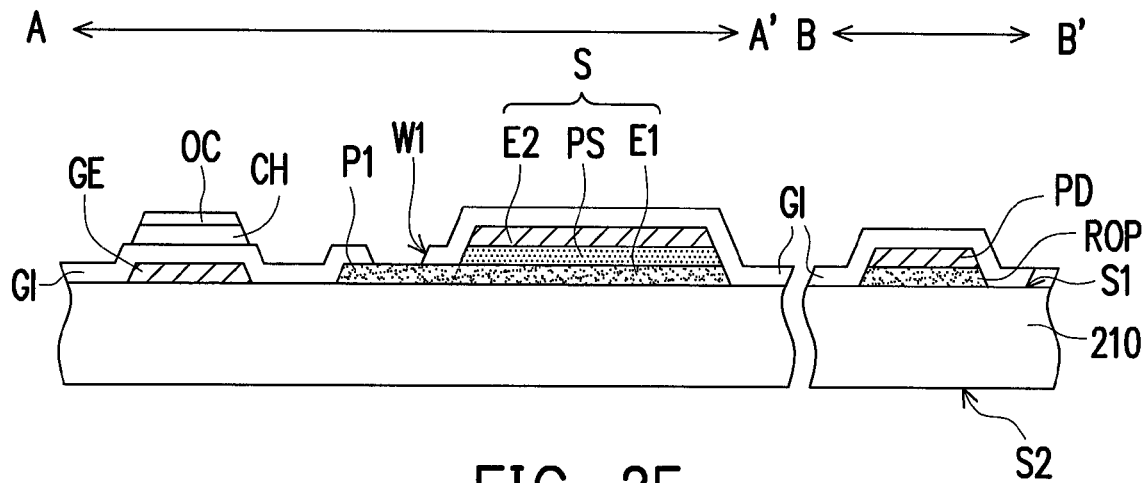
Figure 3E:
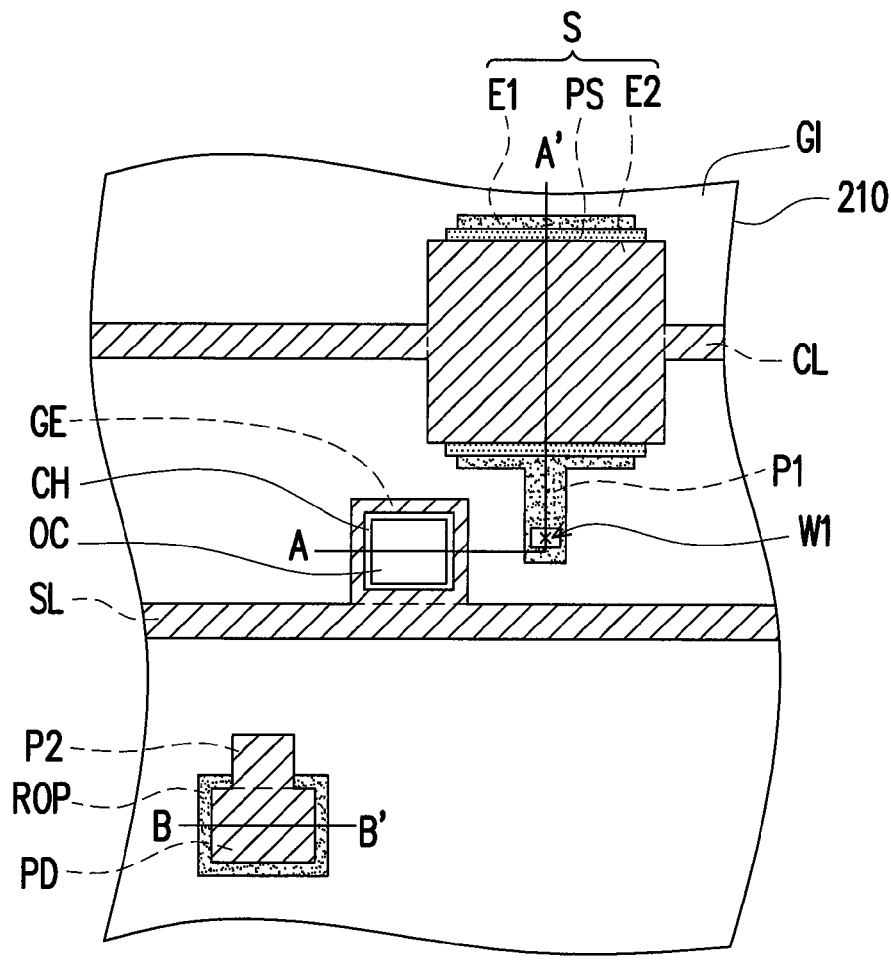

Referring to FIG. 2E and FIG. 3E, a plurality of channel layers CH are formed on the first dielectric layer GI, wherein the channel layers CH are located above the corresponding gate electrodes GE. In the embodiment, after the channel layers CH are formed, an ohmic contact layer OC is formed on the corresponding channel layers CH, in order to reduce the resistance between the channel layers CH and the follow-up layers (source electrodes and drain electrodes, for example).

Figure 2F:
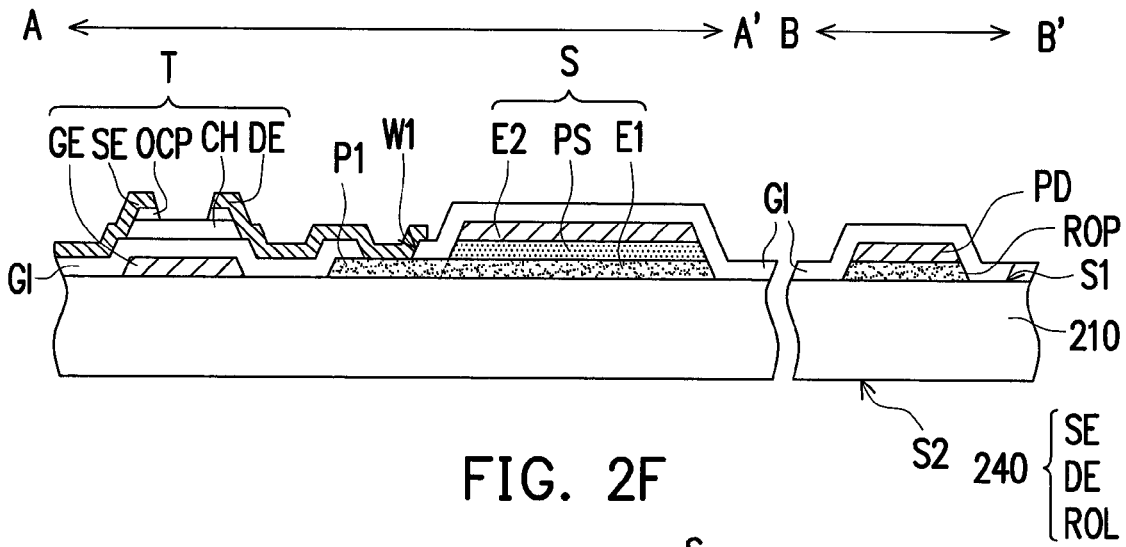
Figure 3F:
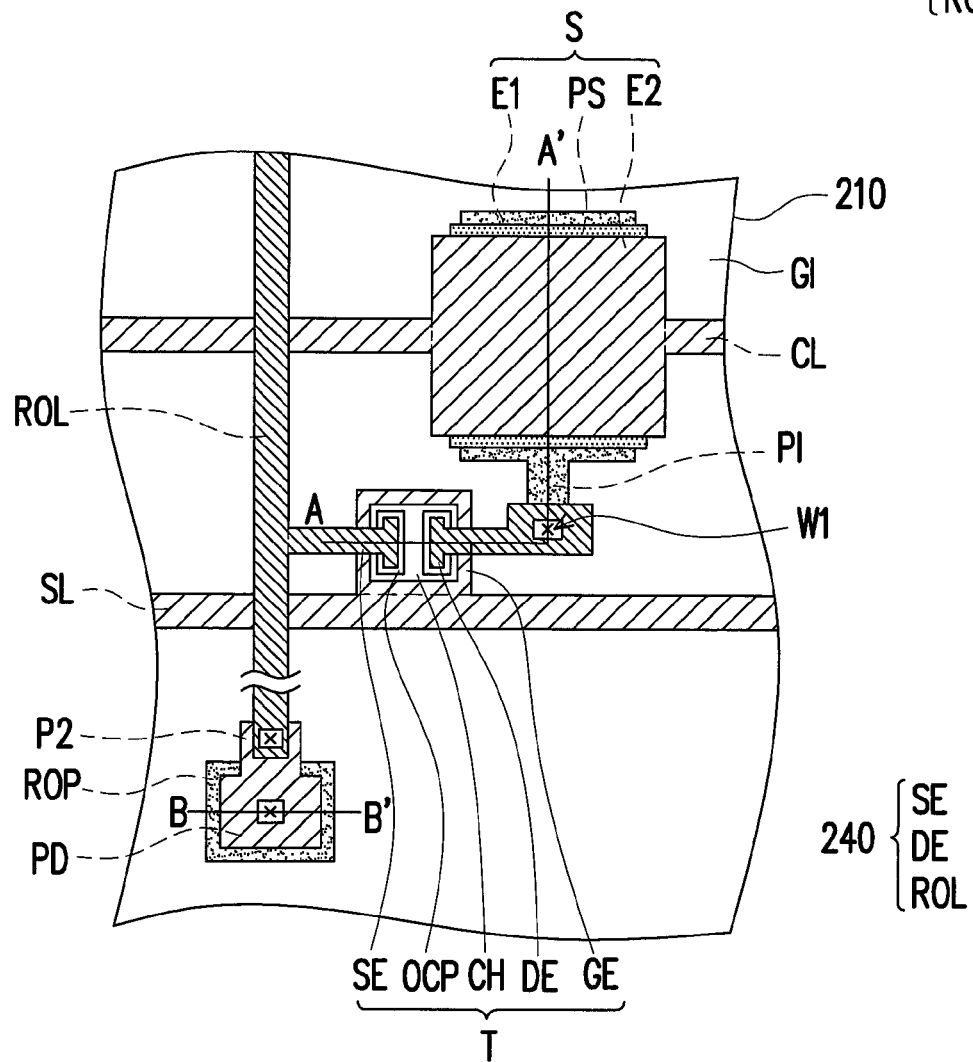

Referring to FIG. 2F and FIG. 3F, a second patterned conductive layer 240 is formed, wherein the second patterned conductive layer 240 includes a plurality of source electrodes SE, a plurality of drain electrodes DE arranged in parallel with the source electrodes SE and a plurality of read-out lines ROL connected to the source electrodes SE. In the embodiment, the method of forming the second patterned conductive layer 240 is, for example, forming a single-layered or multi-layered metal, then patterning the single-layered or multi-layered metal to form the source electrodes SE, the drain electrodes DE and the read-out lines ROL, and simultaneously, removing a portion of the ohmic contact layer OC by using the source electrodes SE and the drain electrodes DE as masks to form ohmic contact patterns OCP.

Specifically, the source electrodes SE and the drain electrodes DE are electrically insulated to each other and respectively located on the corresponding ohmic contact patterns OCP, and on the two opposite sides of the channel layers CH. Herein the gate electrodes GE, the channel layers CH, the source electrodes SE and the drain electrodes DE constitute a plurality of read-out transistors T, and each of the read-out transistors T is electrically connected to the corresponding photo-sensor S, the read-out pads ROP and the corresponding bonding pad PD, respectively. Specifically, the drain electrode DE of each of the read-out transistors T is electrically connected to the contact portion P1 of the patterned transparent conductive layer 220 through the contact window W1. And each of the read-out transistors T is electrically connected to the contact portion P2 of the corresponding bonding pad PD through the read-out line ROL connected to the source electrode SE. After the second patterned conductive layer 240 is formed, the fabricating of the touch panel 200 of the present embodiment is initially completed. Certainly, in order to further avoid the read-out transistors T being affected by external environment, the touch panel 100 of the present embodiment can includes other extra layers.

Figure 2G:
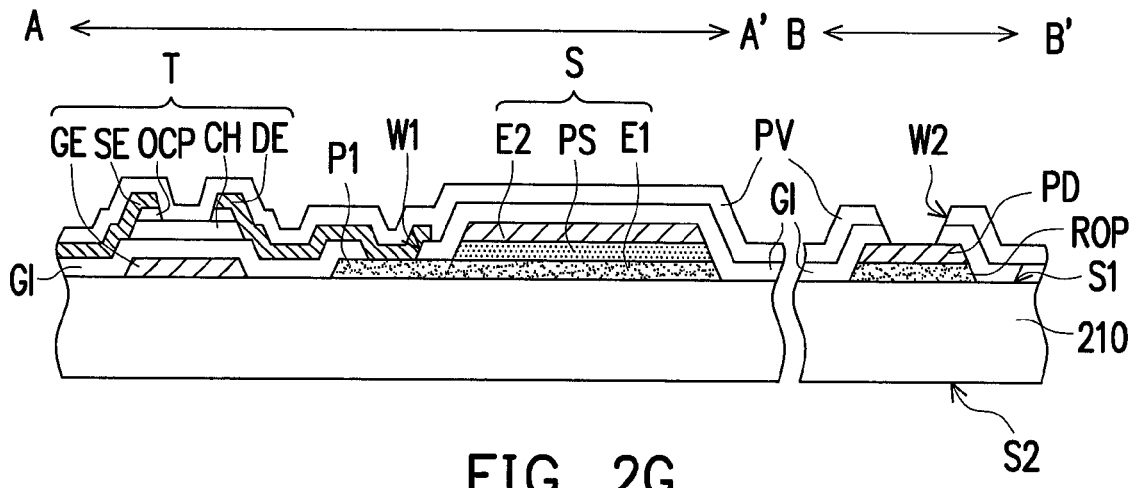
Figure 3G:
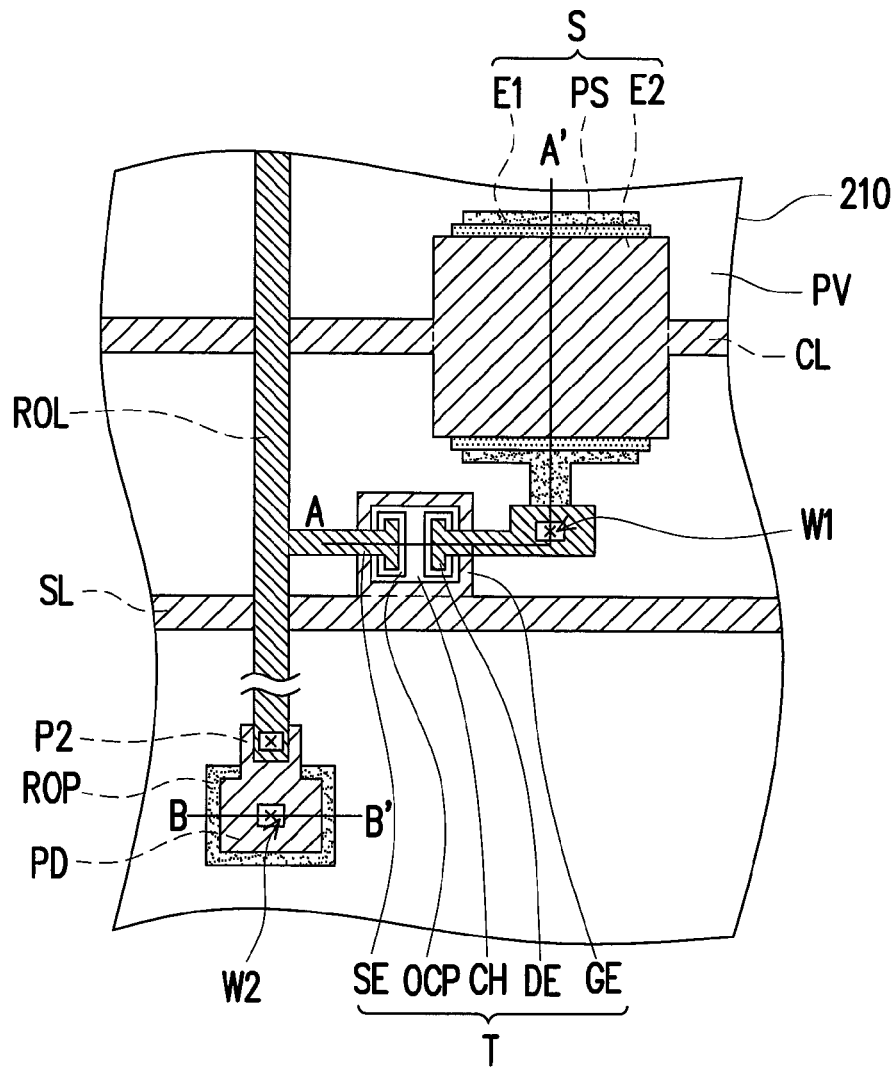

Referring to FIG. 2G and FIG. 3G, next, a second dielectric layer PV is formed on the photo-sensors S and the read-out transistors T, and then the second dielectric layer PV is patterned to form a contact window W2 on the second dielectric layer PV corresponding to each bonding pad PD, wherein the contact window W2 exposes a portion of bonding pads PD so that each of the driving chips (not shown) can be disposed corresponding to the contact windows W2. In addition, the second dielectric layer PV is, for example, an inorganic material (e.g. silicon oxide, silicon nitride, silicon oxynitride, silica-alumina, other suitable materials, or a stacked layer including at least two of the above materials), an organic material, or a combination thereof Certainly, the present invention is not limited thereto, and any other material having insulating property can be selectively applied to the embodiment.

Figure 2H:
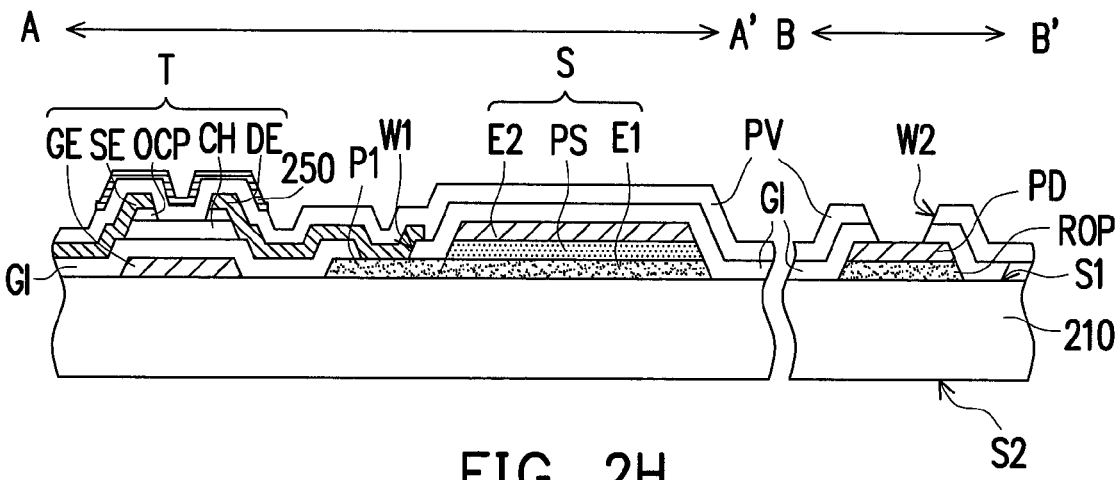
Figure 3H:
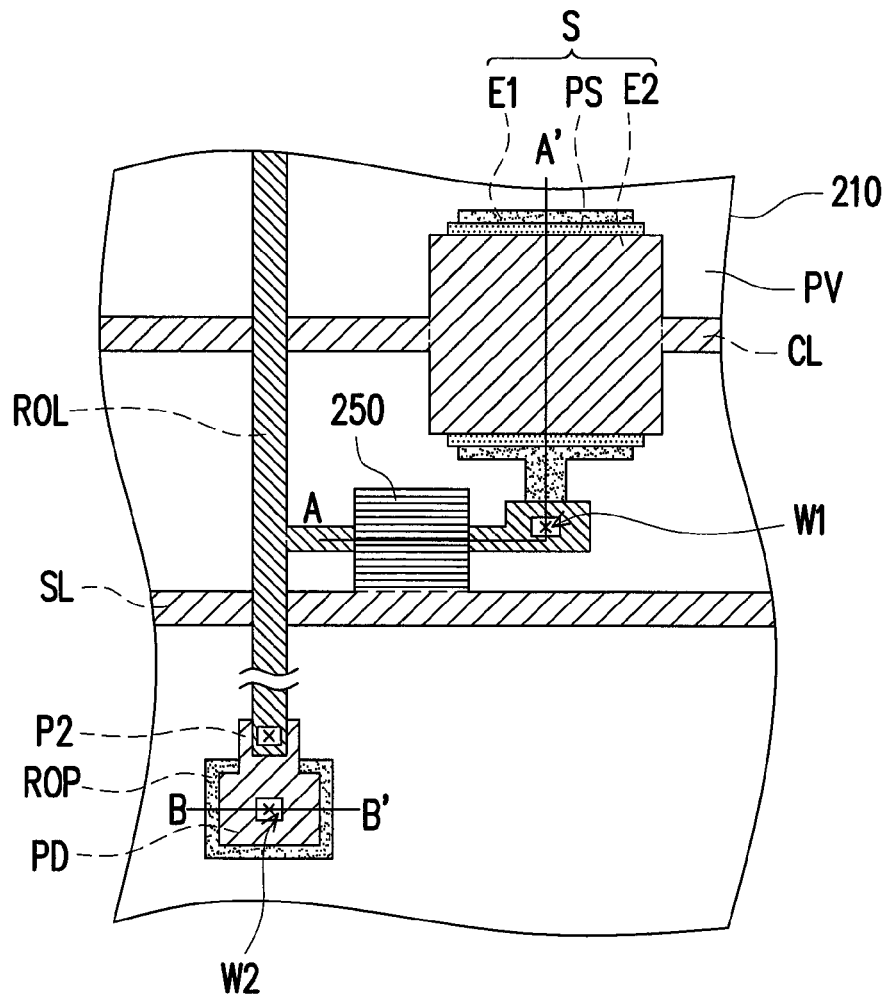
Figure 21:
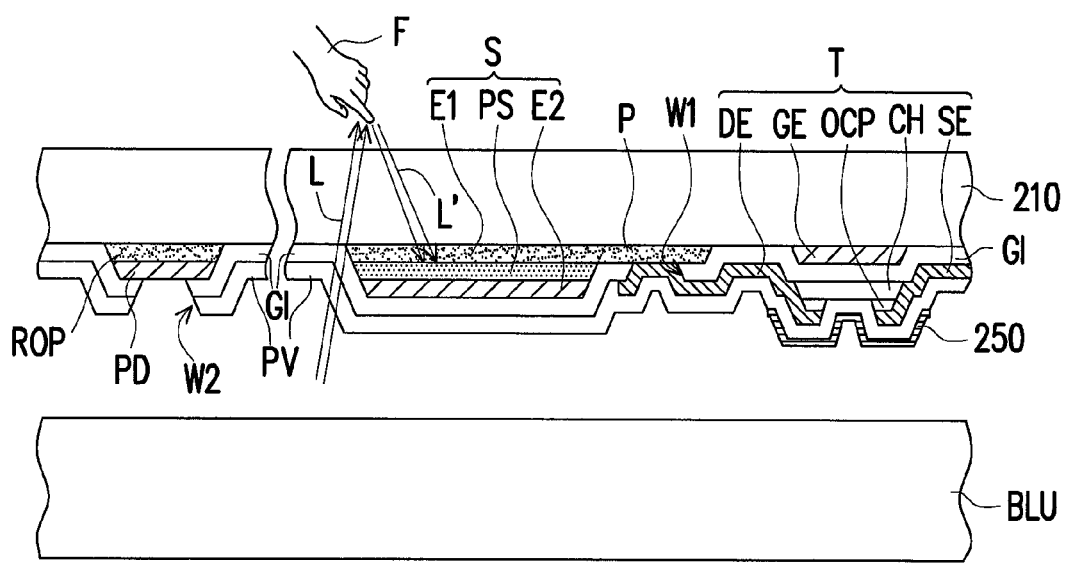

Referring to FIG. 2H and FIG. 3H, a third patterned conductive layer 250 is formed on the second dielectric layer PV, wherein the third patterned conductive layer 250 shields the channel layers CH. In other words, the third patterned conductive layer 250 can shield the interference caused to the channel layers CH by the backlight. Accordingly, the photo leakage current of the read-out transistors T due to illumination can be decreased, thus the photoelectric property of the read-out transistors T can be further enhanced.

Referring to FIG. 2I, the touch panel 200 of the present embodiment further includes a backlight unit BLU, wherein the third patterned conductive layer 250 is located between the backlight unit BLU and the channel layers CH. Specifically, in the touch panel 200 of the embodiment, each of the aforementioned layers is located between the substrate 210 and the backlight unit BLU. Therefore, the touch panel 200 of the embodiment has no need to dispose other extra protective components, the touch panel 200 can avoid the read-out transistors T and the photo-sensors S causing damages due to external environment and human factors. Thus, the touch panel 200 of the present embodiment has comparatively simpler fabricating process and lower manufacturing cost.

In such configuration, when there is no touch event occurs in the touch panel 200, the current is transmitted from the read-out pads to the source electrodes, and then transmitted to the drain electrodes. When the outer surface of the touch panel 200 is touched by a finger F or any other light reflective things, the light of the backlight unit BLU is reflected by the finger F, then the reflected light L' is absorbed by the photo-sensing layer PS and produces a photocurrent, and the first electrode E1 generates a voltage drop (i.e., a voltage difference between the first electrode E1 and the common line CL). The voltage drop is read by the chip through the read-out line ROL, in order to determine the location of the touch. Certainly, the structure (the disposing of light source and the layers) of the touch panel of the present invention is not limited thereto.

Second Embodiment

Figure 4:
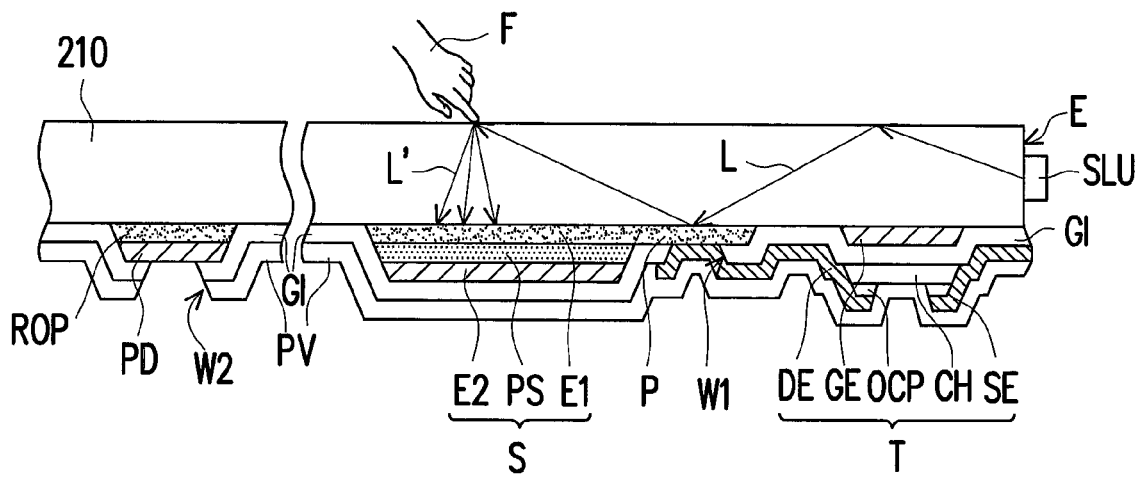
FIG. 4 is a cross-sectional view of a touch panel according to the second embodiment of the present invention.

FIG. 4 is a cross-sectional view of a touch panel according to the second embodiment of the present invention.

Referring to FIG. 4, the touch panel 400 of the present embodiment further includes a side light source SLU adjacent to an edge E of the substrate 210, wherein the side light source SLU is adapted to provide light L to the interior of the substrate 210. When the outer surface of the touch panel 400 is touched by a finger F or any other light reflective things, the light L incident to the interior of the substrate 210 through the edge E is reflected by the finger F. At this time, the reflected light L' is absorbed by the photo-sensing layer PS and produces a photocurrent, then the first electrode E1 generates a voltage drop (i.e., a voltage difference between the first electrode E1 and the common line CL). The voltage drop is read by the chip through the read-out line ROL, in order to determine the location of the touch.

It has to be noted that, since the light source is disposed at the edge E of the substrate 210 in the present embodiment, but not at the opposite side of the substrate 210, the third patterned conductive layer is selectively not to be disposed for shielding the channel layers CH. In addition, since the touch panel 400 is placed upside down, it makes the gate electrodes GE shield the channel layers CH of the read-out transistors T. Therefore, in the embodiment, the read-out transistors T can use the gate electrodes GE for light shielding, and the photo leakage current of the read-out transistors T due to illumination can be decreased. Thus, the photoelectric property of the read-out transistors T can be further enhanced.

Third Embodiment

Figure 5:
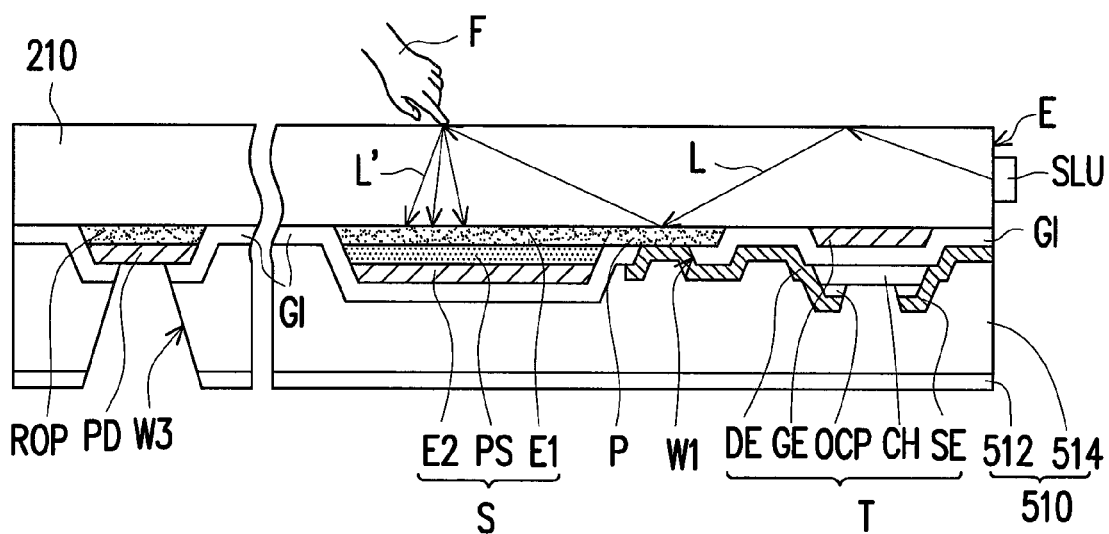
FIG. 5 is a cross-sectional view of a touch panel according to the third embodiment of the present invention.

FIG. 5 is a cross-sectional view of a touch panel according to the third embodiment of the present invention.

Referring to FIG. 5, the touch panel 500 of the present embodiment further includes an encapsulant 510, wherein the fabricating method of the encapsulant 510 includes forming an organic planarization layer 512 on the photo-sensors S and the read-out transistors T, and forming a thin film encapsulant 514 on the organic planarization layer 512. In addition, the first dielectric layer GI corresponding to the bonding pads PD, the organic planarization layer 512 and the thin film encapsulant 514 have a contact window W3, and the contact window W3 exposes a portion of bonding pads PD, in order that the driving chip (not shown) can be disposed corresponding to the contact window W3.

Furthermore, the touch panel 500 of the present embodiment further includes a side light source SLU adjacent to an edge E of the substrate 210, wherein the side light source SLU is adapted to provide light L to the interior of the substrate 210. When the outer surface of the touch panel 500 is touched by a finger F or any other light reflective things, the light L incident to the interior of the substrate 210 through the edge E is reflected by the finger F. At this time, the reflected light L' is absorbed by the photo-sensing layer PS and produces a photocurrent, then the first electrode E1 generates a voltage drop (i.e., a voltage difference between the first electrode E1 and the common line CL). The voltage drop is read by the chip through the read-out line ROL, in order to determine the location of the touch.

In light of the foregoing, a touch-sensing circuit including read-out transistors and photo-sensing layers are formed on a substrate in the exemplary embodiments of the present invention, and because of the substrate, all the thin film layers in the touch-sensing circuit can be protected from causing damages due to external environment and human factors.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A touch panel, comprising:
a substrate;
a patterned transparent conductive layer disposed on the substrate, the patterned transparent conductive layer comprising a plurality of first electrodes;
a plurality of photo-sensing layers disposed on the first electrodes;
a first patterned conductive layer comprising a plurality of gate electrodes, a plurality of scan lines connected to the gate electrodes and a plurality of second electrodes, wherein the gate electrodes and the scan lines are located on the substrate, the second electrodes are located on the photo-sensing layers, and the first electrodes, the photo-sensing layers and the second electrodes constitute a plurality of photo-sensors;
a first dielectric layer disposed on the substrate to cover the gate electrodes, the scan lines and the photo-sensors such that the photo-sensors are located between the substrate and the first dielectric layer; wherein the first dielectric layer is a gate dielectric layer;
a plurality of channel layers disposed on the first dielectric layer and located above the gate electrodes; and
a second patterned conductive layer comprising a plurality of source electrodes and a plurality of drain electrodes, wherein the gate electrodes, the channel layers, the source electrodes and the drain electrodes constitute a plurality of read-out transistors, and each of the read-out transistors is electrically connected to the corresponding photo-sensor, respectively.

2. The touch panel as claimed in claim 1, wherein the photo-sensing layers comprise a silicon-rich oxide layer.

3. The touch panel as claimed in claim 1, further comprising a side light source adjacent to an edge of the substrate.

4. The touch panel as claimed in claim 1, wherein the gate electrodes, the scan lines, and the second electrodes of the first patterned conductive layer are formed by a same layer, and the source electrodes and the drain electrodes of the second patterned conductive layer are formed by a same layer.

5. The touch panel as claimed in claim 1, wherein a material of the patterned transparent conductive layer comprises indium tin oxide (ITO), indium zinc oxide (IZO), aluminum tin oxide (ATO), aluminum zinc oxide (AZO), and indium germanium zinc oxide (IGZO) and a material of the first patterned conductive layer comprises metal.

6. The touch panel as claimed in claim 1, wherein the patterned transparent conductive layer further comprises a plurality of read-out pads.

7. The touch panel as claimed in claim 6, wherein the first patterned conductive layer further comprises a plurality of bonding pads, each of the bonding pads covers one of the read-out pads, and each of the read-out transistors is electrically connected to the corresponding read-out pad and the corresponding bonding pad, respectively.

8. The touch panel as claimed in claim 1, further comprising an encapsulant covering the photo-sensors and the read-out transistors.

9. The touch panel as claimed in claim 8, wherein the encapsulant comprises:
an organic planarization layer covering the photo-sensors and the read-out transistors; and
a thin film encapsulant disposed on the organic planarization layer.

10. The touch panel as claimed in claim 1, further comprising:
a second dielectric layer covering the photo-sensors and the read-out transistors; and
a third patterned conductive layer disposed on the second dielectric layer, wherein the third patterned conductive layer shields the channel layers.

11. The touch panel as claimed in claim 10, further comprising a backlight unit, wherein the third patterned conductive layer is located between the backlight unit and the channel layers.

12. The touch panel as claimed in claim 10, wherein the second dielectric layer completely covers the photo-sensors and the read-out transistors, and wherein the third patterned conductive layer contacts the second dielectric layer.

13. A fabricating method of a touch panel, comprising:
forming a patterned transparent conductive layer on a substrate, wherein the patterned transparent conductive layer comprises a plurality of first electrodes;
forming a plurality of photo-sensing layers on the first electrodes;
forming a first patterned conductive layer, wherein the first patterned conductive layer comprises a plurality of gate electrodes, a plurality of scan lines connected to the gate electrodes and a plurality of second electrodes, the gate electrodes and the scan lines are located on the substrate, the second electrodes are located on the photo-sensing layers, and the first electrodes, the photo-sensing layers and the second electrodes constitute a plurality of photo-sensors;
forming a first dielectric layer on the substrate to cover the gate electrodes, the scan lines and the photo-sensors such that the photo-sensors are located between the substrate and the first dielectric layer; wherein the first dielectric layer is a gate dielectric layer;
forming a plurality of channel layers on the first dielectric layer, wherein the channel layers are located above the gate electrodes; and
forming a second patterned conductive layer, wherein the second patterned conductive layer comprises a plurality of source electrodes and a plurality of drain electrodes, the gate electrodes, the channel layers, the source electrodes and the drain electrodes constitute a plurality of read-out transistors, and each of the read-out transistors is electrically connected to the corresponding photo-sensor, respectively.

14. The fabrication method of the touch panel as claimed in claim 10, further comprising providing a side light source adjacent to an edge of the substrate.

15. The fabrication method of the touch panel as claimed in claim 13, wherein the gate electrodes, the scan lines, and the second electrodes of the first patterned conductive layer are formed by a same layer, and the source electrodes and the drain electrodes of the second patterned conductive layer are formed by a same layer.

16. The fabrication method of the touch panel as claimed in claim 13, wherein the step of forming a first patterned conductive layer is conducted after the step of forming a patterned transparent conductive layer on a substrate and the step of forming a plurality of photo-sensing layers on the first electrodes.

17. The fabricating method of a touch panel as claimed in claim 13, wherein the patterned transparent conductive layer further comprises a plurality of read-out pads on the substrate.

18. The fabricating method of a touch panel as claimed in claim 17, wherein the first patterned conductive layer further comprises a plurality of bonding pads on the read-out pads, and wherein each of the read-out transistors is electrically connected to the corresponding read-out pad and the corresponding bonding pad, respectively.

19. The fabrication method of the touch panel as claimed in claim 13, further comprising forming an encapsulant on the photo-sensors and the read-out transistors.

20. The fabrication method of the touch panel as claimed in claim 19, wherein the step of forming the encapsulant comprises:
forming an organic planarization layer on the photo-sensors and the read-out transistors; and
forming a thin film encapsulant on the organic planarization layer.

21. The fabrication method of the touch panel as claimed in claim 13, further comprising:
forming a second dielectric layer on the photo-sensors and the read-out transistors; and
forming a third patterned conductive layer on the second dielectric layer, wherein the third patterned conductive layer shields the channel layers.

22. The fabrication method of the touch panel as claimed in claim 21, further comprising providing a backlight unit, wherein the third patterned conductive layer is located between the backlight unit and the channel layers.

23. The fabrication method of the touch panel as claimed in claim 21, wherein the second dielectric layer completely covers the photo-sensors and the read-out transistors, and wherein the third patterned conductive layer contacts the second dielectric layer.

* * * * *